(12) United States Patent
Timmins et al.

(10) Patent No.: US 12,452,996 B2
(45) Date of Patent: Oct. 21, 2025

(54) ANTENNA BACKPLANE WITH REDUCED CROSSTALK AND METHOD FOR MAKING SAME

(71) Applicant: JABIL INC., St. Petersburg, FL (US)

(72) Inventors: Ian Jeffery Timmins, St. Petersburg, FL (US); Babak Zarrin Rafie, St. Petersburg, FL (US); John Finnell, St. Petersburg, FL (US)

(73) Assignee: JABIL INC., St. Petersburg, FL (US)

( * ) Notice: Subject to any disclaimer, the term of this patent is extended or adjusted under 35 U.S.C. 154(b) by 206 days.

(21) Appl. No.: 18/553,623

(22) PCT Filed: Mar. 14, 2022

(86) PCT No.: PCT/US2022/071119
§ 371 (c)(1),
(2) Date: Oct. 2, 2023

(87) PCT Pub. No.: WO2022/213017
PCT Pub. Date: Oct. 6, 2022

(65) Prior Publication Data
US 2024/0188211 A1    Jun. 6, 2024

Related U.S. Application Data

(60) Provisional application No. 63/261,000, filed on Sep. 8, 2021, provisional application No. 63/169,106, filed on Mar. 31, 2021.

(51) Int. Cl.
*H05K 1/02* (2006.01)
*H01Q 1/52* (2006.01)
*H03H 7/18* (2006.01)

(52) U.S. Cl.
CPC ............. *H05K 1/0243* (2013.01); *H01Q 1/52* (2013.01); *H03H 7/18* (2013.01)

(58) Field of Classification Search
CPC .... H05K 1/0243; H05K 1/0245; H05K 1/025; H01Q 1/52
See application file for complete search history.

(56) References Cited

U.S. PATENT DOCUMENTS 10,326,197 B2    6/2019    Davis
2015/0085903 A1  3/2015    Gundel et al.
(Continued)

FOREIGN PATENT DOCUMENTS

EP    2387295 A1    11/2011
JP    202043251 A    3/2020

*Primary Examiner* — Nathan Milakovich
(74) *Attorney, Agent, or Firm* — Shumaker, Loop & Kendrick, LLP; James D. Miller

(57) ABSTRACT

An antenna backplane including a printed circuit board (PCB) having a first differential pair with a first conductor and a second conductor and a second differential pair with a third conductor and a fourth conductor. The first conductor is positioned a first distance from the second differential pair and the second conductor is positioned a second distance from the second differential pair of conductors, where the first distance is greater than the second distance. The third conductor is positioned the second distance from the first differential pair and the fourth conductor is positioned a third distance from the first differential pair, where the third distance is greater than the second distance. A phase-shifting series resonant circuit is coupled between the first conductor and the fourth conductor that provides approximately an odd-integer multiple of a 180 degree phase shift at a pre-determined frequency.

20 Claims, 4 Drawing Sheets

(56) References Cited

U.S. PATENT DOCUMENTS

2017/0331250 A1 11/2017 Kagaya
2018/0026681 A1 1/2018 McCormack
2018/0076376 A1 3/2018 Brady et al.

ANTENNA BACKPLANE WITH REDUCED CROSSTALK AND METHOD FOR MAKING SAME

BACKGROUND

Field

This disclosure relates generally to antenna backplanes and, more particularly, to millimeter wave (mmW) antenna backplanes, antenna backplanes with improved return loss, improved impedance matching and reduced signal rejection of differential pairs, and antenna backplanes having high pin connectors with reduced crosstalk between differential pairs.

Discussion of the Related Art

Cellular telecommunications companies began deploying the fifth generation (5G) radio technology standard for cellular networks in 2019. The 5G radio standard utilizes a higher frequency spectrum than previous generations of commercial communications technologies. MmW phased array antennas are being designed and developed for the 5G standard that provides increased performance over 4G systems while also reducing costs. Often, a high pin count connector is used as a transmission line component between a main module circuit board and a secondary circuit board in these types of phased array antenna. Higher frequencies and a higher pin count for a given connector size causes a more severe discontinuity, which rejects the input signal to the connector back to the source. One way of reducing this rejection is to increase the spacing between the traces of a differential pair, which increases the size of the printed circuit board (PCB), increases the cost of the system and/or may not be feasible in a particular environment.

SUMMARY

The following discussion discloses and describes an antenna backplane including a printed circuit board (PCB) having a first differential pair with a first conductor and a second conductor and a second differential pair with a third conductor and a fourth conductor. The first conductor is positioned a first distance from the second differential pair and the second conductor is positioned a second distance from the second differential pair of conductors, where the first distance is greater than the second distance. The third conductor is positioned the second distance from the first differential pair and the fourth conductor is positioned a third distance from the first differential pair, where the third distance is greater than the second distance. A phase-shifting series resonant or tuning circuit is coupled between the first conductor and the fourth conductor and provides approximately an odd-integer multiple of a 180 degree phase shift at a predetermined frequency.

Additional features of the disclosure will become apparent from the following description and appended claims, taken in conjunction with the accompanying drawings.

BRIEF DESCRIPTION OF THE DRAWINGS

In the non-limiting embodiments discussed herein, like numerals indicate like elements throughout the several FIGS.

DETAILED DESCRIPTION

The following discussion of the embodiments of the disclosure directed to an antenna backplane that provides reduced signal rejection of differential pairs is merely exemplary in nature, and is in no way intended to limit the disclosure or its applications or uses.

The present disclosure proposes various embodiments of an antenna backplane having reduced signal rejection of differential pairs by using a phase-shifting series resonant or tuning stub circuit provided between outer conductors of the differential pairs. The phase-shifting series resonant or tuning stub circuit may exhibit series resonance at a desired operating frequency and a phase shift of an odd integer multiple of 180 degrees at a desired operating frequency, where the phase shift may be provided by one or more striplines or microstrips having an appropriate length. Tuning stub circuits are well known in connection with RF transmission lines. However, in the embodiments discussed herein, two tuning stubs are simultaneously used to improve the transmission of an RF signal through a connector, where the transmission line is implemented as a differential pair.

In one non-limiting embodiment, the antenna backplane includes a first differential pair and a second differential pair, where the first differential pair includes a first conductor and a second conductor, the second conductor is closer to the second differential pair than the first conductor, the second differential pair includes a third conductor and a fourth conductor, and the third conductor is closer to the first differential pair than the fourth conductor. The phase-shifting series resonant circuit is connected between the first conductor and the fourth conductor.

In another non-limiting embodiment, the antenna backplane includes a PCB having a first side and a second side, where the second side includes a ground plane. A first differential pair having a first conductor and a second conductor is provided on the first side and a second differential pair having a third conductor and a fourth conductor is provided on the first side, where the second conductor is closer to the second differential pair than the first conductor and the third conductor is closer to the first differential pair than the fourth conductor. The PCB also includes a fifth conductor connected to the first conductor having a first length and being on the first side, and a sixth conductor connected to the fourth conductor having a second length and also being on the first side, where an edge of the fifth conductor is parallel to an edge of the sixth conductor and provides an overlap distance. In this embodiment, the fifth conductor and the sixth conductor form the phase-shifting series resonant circuit.

Figure 1:
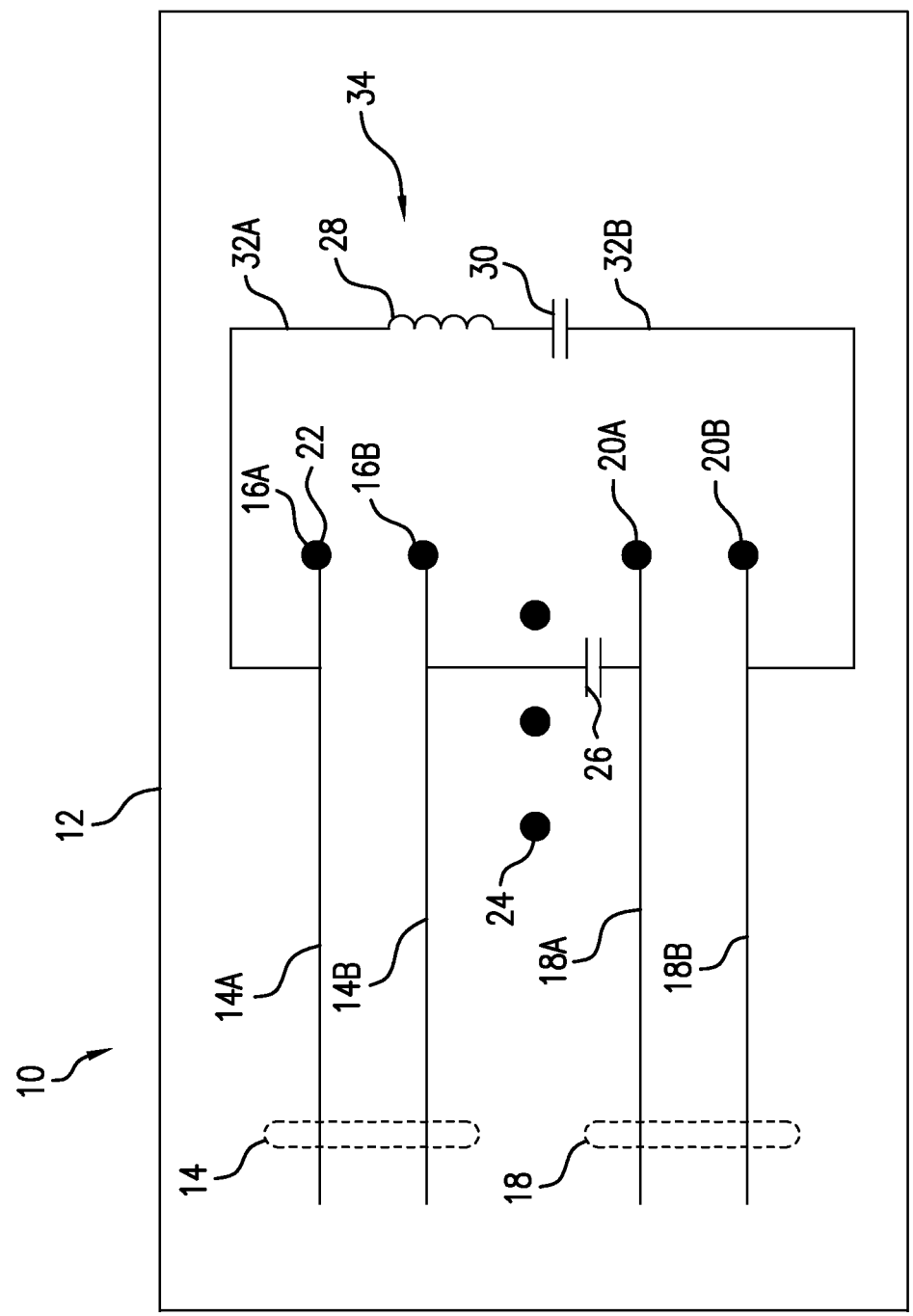
FIG. 1 is an illustration of an antenna backplane including a phase-shifting series resonant or tuning stub circuit.
Figure 2:
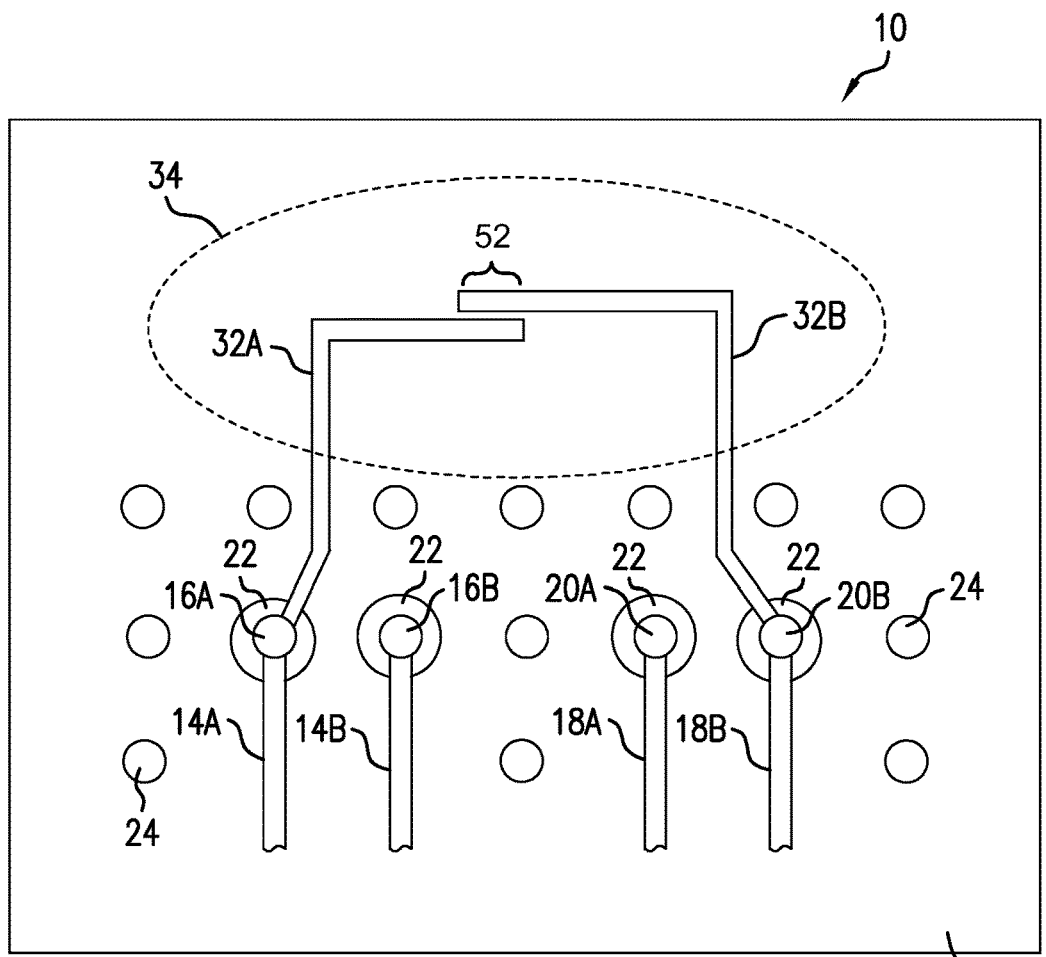
FIG. 2 is another illustration of the antenna backplane shown in FIG. 1.

FIG. 1 is a schematic diagram and FIG. 2 is a top view of an antenna backplane 10 including a PCB 12 having a dielectric board and conductive traces and/or ground planes on both sides of the dielectric board. In other embodiments, the antenna backplane 10 can include a multi-layer PCB having multiple dielectric layers and conductive traces and/or ground planes between the various dielectric layers and/or on the outside of the outermost dielectric layers. Although the discussion herein refers to the antenna backplane 10 as being part of a phased array antenna, it will be appreciated by those skilled in the art that the antenna backplane 10 may be used in other devices and systems where it is desirable to reduce signal rejection of differential pairs. The antenna backplane 10 provides power and control signals to a plurality of RF transceiver antenna circuits (not shown) in the phased array antenna.

It is noted that a conductive trace on a PCB having a single dielectric layer is often referred to as a microstrip, and a conductive trace surrounded by dielectric material and between two ground planes on internal layers of a PCB having two or more dielectric layers is often referred to as a stripline. For convenience, conductive traces, such as microstrips and striplines, are referred to herein as "conductors." The antenna backplane 10 includes a first differential pair 14 having an outer conductor 14A and an inner conductor 14B coupled to connection points 16A and 16B, respectively, and a second differential pair 18 having an inner conductor 18A and an outer conductor 18B coupled to connection points 20A and 20B, respectively. The connection points 16A, 16B, 20A and 20B include connection pads 22 on the PCB 12 to which a connector (not shown) will be mounted. The antenna backplane 10 also includes a number of grounding pins 24 (or a grounding strip) between and around the differential pairs 14 and 18. Capacitive and/or inductive coupling illustrated by capacitor 26 between the inner conductors 14B and 18A could cause crosstalk between the differential pairs 14 and 18.

The antenna backplane 10 includes a phase-shifting series resonant circuit 34 having an inductor 28, a capacitor 30 and conductive strips 32A and 32B, which may be, for example, microstrips, where the conductive strip 32A is electrically coupled to the outer conductor 14A and the conductive strip 32B is electrically coupled to the outer conductor 18B. Signals on the differential pairs 14 and 18 are provided at a known operating frequency, and the phase-shifting series resonant circuit 34 resonates at or near the operating frequency. Thus, signals on the outer conductors 14A and 18B may be cross-coupled by the phase-shifting series resonant circuit 34. Without additional protection, the cross-coupling may increase the overall crosstalk between the differential pairs 14 and 18, where the longer that the inner conductors 14B and 18A run beside each other, the greater the coupling and crosstalk between them will be. Thus, the capacitance of the capacitor 30 can be increased to provide appropriate coupling between the inner conductors 14A and 18B. The value of the capacitor 30 can be determined by the length of an overlap distance 52 at the edges of the conductive strips 32A and 32B, and/or the area of the sides of the conductive strips 32A and 32B facing each other at the overlap distance 52. For a certain overlap distance 52 of the conductive strips 32A and 32B, using a thinner conductive strip provides smaller areas facing each other along the edges, and therefore results in a smaller value for the capacitor 30 than will result from using thicker conductive strips.

Figure 3:
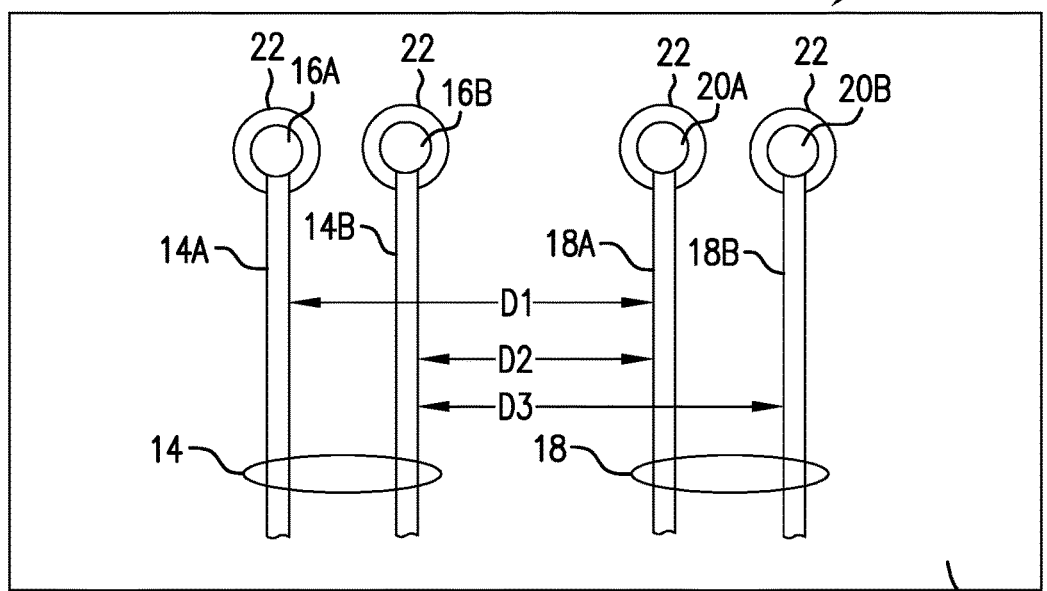
FIG. 3 is another illustration of the antenna backplane shown in FIG. 1 showing separation distances between conductors.

FIG. 3 is an illustration of the antenna backplane 10 showing separation distances between the conductors including a first distance D1 between the outer conductor 14A of the differential pair 14 and the inner conductor 18A of the differential pair 18, a second distance D2 between the inner conductor 14B of the differential pair 14 and the inner conductor 18A of the differential pair 18, and a third distance D3 between the outer conductor 18B of the differential pair 18 and the inner conductor 14B of the differential pair 14. As is apparent, the first distance D1 and the third distance D3 are the same and the second distance D2 is less than the distances D1 and D3.

To reduce crosstalk between the differential pairs 14 and 18, the length of the conductive strips 32A and 32B can be selected to provide a phase shift of approximately an odd integer multiple of 180 degrees so that the cross-coupled signals on the outer conductors 14A and 18B are approximately at the same phase as the cross-coupled signals on the inner conductors 14B and 18A. In one embodiment, the length of the conductive strips 32A and 32B is selected to provide a phase shift that is approximately 180 degrees, where the odd integer is 1. When the cross-coupled signals are approximately in phase, the signals will be rejected as common-mode noise by differential receivers (not shown) connected to the connection points 16A, 16B, 20A and 20B, thereby increasing isolation between the differential pairs 14 and 18. Further, isolation between the differential pairs 14 and 18 can be increased by passing intermediate frequency (IF) signals through a high pin count connector of a mmW antenna system.

The amount of coupling between the outer conductors 14A and 18B can be controlled by adjusting the value of the capacitor 30 and/or the value of the inductor 28. The phase delay can be controlled by adjusting the length of one or both of the conductive strips 32A and 32B. If a long length of one or both of the conductive strips 32A and 32B is used to achieve a desired delay, such as where the odd integer multiple is three or more, and/or where the operating frequency is lower, then one or both of the conductive strips 32A and 32B can meander or fold back on itself to achieve the desired delay without increasing the self-inductance.

The phase-shifting series resonant circuit 34 increases the isolation (reduces signal rejection and decreases the crosstalk) between the differential pairs 14 and 18, thereby allowing shorter profile, high pin count connectors to be used as transmission line components between the antenna backplane 10, which may be a main module circuit board, and a secondary circuit board of the phased array antenna. The differential pairs 14 and 18 may carry, for example, the IF signals of the phased array antenna. The use of a shorter profile, high pin count connector may also result in cost savings while performance of the system is maintained. The high pin count connector may be of the type typically used for a network server or switch. The phase-shifting series resonant circuit 34 may also reduce the number of ground pins required to achieve a desired level of isolation between the differential pairs 14 and 18. Although the phase-shifting series resonant circuit 34 has been illustrated as being on one side of the antenna backplane 10, it may be used for the differential pairs 14 and 18 on both sides of the antenna backplane 10. Further, the circuit 34 may be used for differential pairs that have conductors on, or within, a multi-layer PCB and on a primary PCB, a mating PCB, or both.

For high frequency circuits, a change in the impedance of the differential pairs 14 and 18 may result in reflections, signal loss, data errors, reduced data transmission speed, and/or other issues. Thus, the impedance of the differential pairs 14 and 18 can be held substantially constant even as the signal passes from one PCB, through one or more connectors and/or cables, to another PCB. The addition of the phase-shifting series resonant circuit 34 between the conductors 14A and 18B may change the impedance of the differential pairs 14 and 18. The size and shape of the pads 22 associated with the conductors 14A, 14B, 18A and 18B may be used to restore the impedance to the desired value.

The capacitor 30 may be implemented, for example, by an edge of the conductive strip 32A being parallel to an edge of the conductive strip 32B for the overlap distance 52, by a surface area (e.g. width, rather than thickness) of the conductive strip 32A facing a surface area of the conductive strip 32B, such as by being on opposite sides of a dielectric of the PCB 12, by the conductive strip 32A and 32B having explicit plate areas that face each other, such as by being on opposite sides of a dielectric of the PCB 50, by the conductive strip 32A and 32B having an interdigital capacitive structure, or by using a discrete surface mount component.

In one non-limiting embodiment, the operating frequency is approximately 4.5 GHZ, and thus one-half wavelength (180 degrees) would be approximately 33.3 mm (1.31 inches) and the combined length of the conductive strips 32A and 32B would be approximately 33.3 mm. Further, the combined length of the conductive strips 32A and 32B is approximately 15 mm, and the approximate length of the overlap distance 52 is 1 mm.

Figure 4:
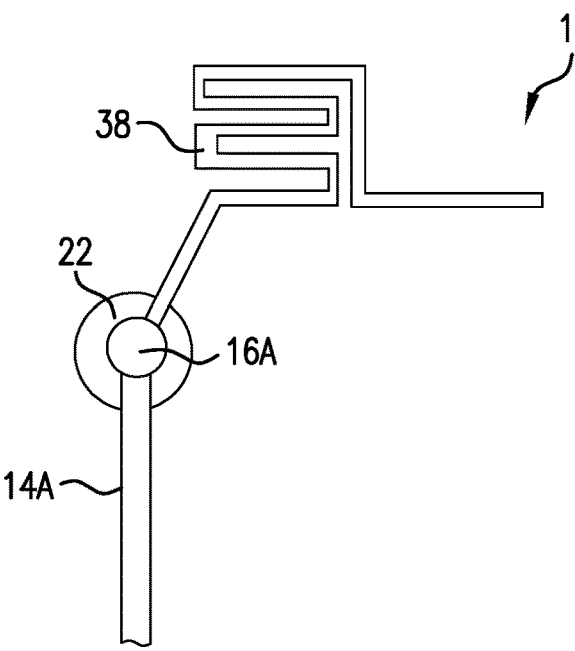
FIG. 4 is an illustration of part of the antenna backplane shown in FIG. 1 and including a meandering a conductive strip.

FIG. 4 is an illustration of a part of the antenna backplane 10 where the conductive strip 32A is replaced with a conductive strip 38 having a meandering configuration, such as by folding back upon itself, to provide a desired length to achieve a desired phase shift without a correspondingly large increase in the value of the inductor 28.

Figure 5:
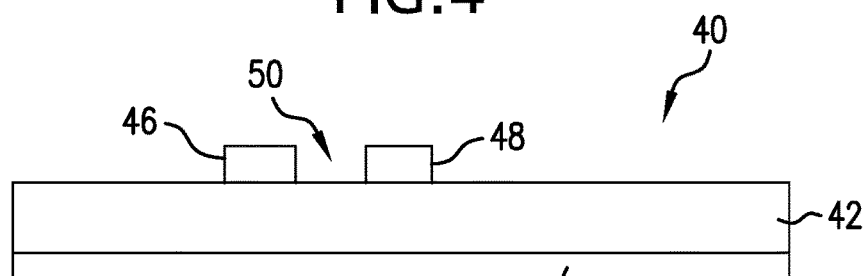
FIG. 5 is an illustration of an antenna backplane including conductive strips that are part of phase-shifting series resonant or tuning stub circuit on one side of a PCB.

FIG. 5 is an illustration of an antenna backplane 40 that is similar to the antenna backplane 10. The antenna backplane 40 includes a PCB 42 having a ground plane 44 formed on the bottom surface of the PCB 42 and a pair of spaced apart conductive strips 46 and 48 formed on a top surface of the PCB 42, where the strips 46 and 48 are similar to the conductive strips 32A and 32B, and where the conductive strips 46 and 48 define an edge-coupled capacitor 50. In this example, the value of the capacitor 50 is determined primarily by the distance between the conductive strips 46 and 48, the height (thicknesses) of the conductive strips 46 and 48, and the overlap distance of the conductive strips 46 and 48. The value of the capacitor 50 may also be affected by the dielectric value of the body of the PCB 42. Although the conductive strips 46 and 48 and the ground plane 44 are shown on opposing sides of the PCB 42, the conductive strips 46 and 48 may be on the same side of the PCB 42 as the ground plane 44, where enough of the ground plane 44 is removed to allow formation of the conductive strips 46 and 48.

Figure 6:
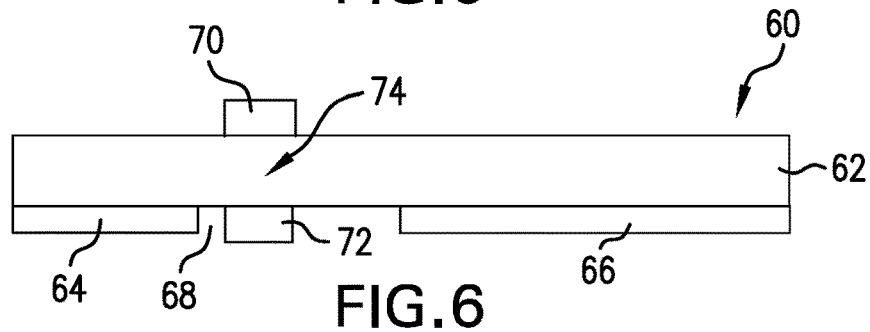
FIG. 6 is an illustration of an antenna backplane including conductive strips that are part of phase-shifting series resonant or tuning stub circuit on opposing sides of a PCB.

FIG. 6 is an illustration of an antenna backplane 60 that is similar to the antenna backplane 10. The antenna backplane 60 includes a PCB 62 having spaced apart ground planes 64 and 66 formed on a bottom surface of the PCB 42 and defining a gap 68 therebetween. A conductive strip 70 is formed on a top surface of the PCB 62 and an opposing conductive strip 72 is formed in the gap 68 on the bottom surface of the PCB 62 to define a face-coupled capacitor 74. In this example, the value of the capacitor 74 is determined primarily by the thickness of the PCB 62, the dielectric constant of the PCB 62, the widths of the conductive strips 70 and 72, and the overlap distance of the conductive strips 70 and 72.

Figure 7:
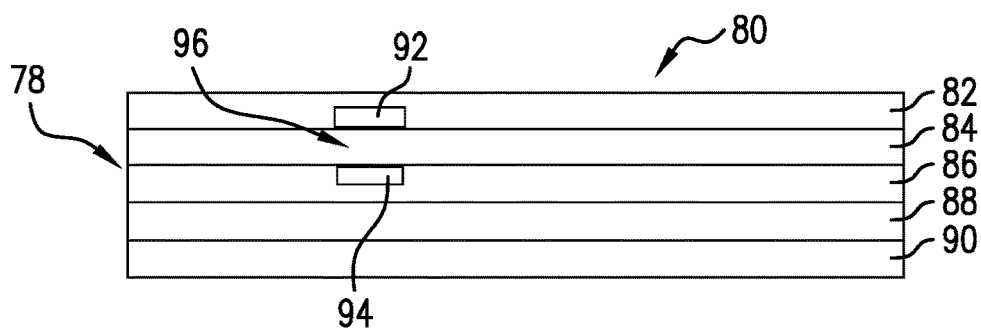
FIG. 7 is an illustration of an antenna backplane including a multilayer PCB.

FIG. 7 is an illustration of an antenna backplane 80 including a multi-layer PCB 78 having stacked PCB layers 82, 84, 86, 88 and 90. A conductive strip 92 is formed on a top surface of the PCB layer 84 and an opposing conductive strip 94 is formed on a bottom surface of the PCB layer 84 to define a face-coupled capacitor 96. In this example, the value of the capacitor 96 is determined primarily by the thickness of the PCB layer 84, the dielectric constant of the PCB layer 84, the facing width of the conductive strips 92 and 94, and the overlap distance of the conductive strips 92 and 94. For clarity and convenience of illustration, ground planes between layers 82-90 are not shown.

Figure 8:
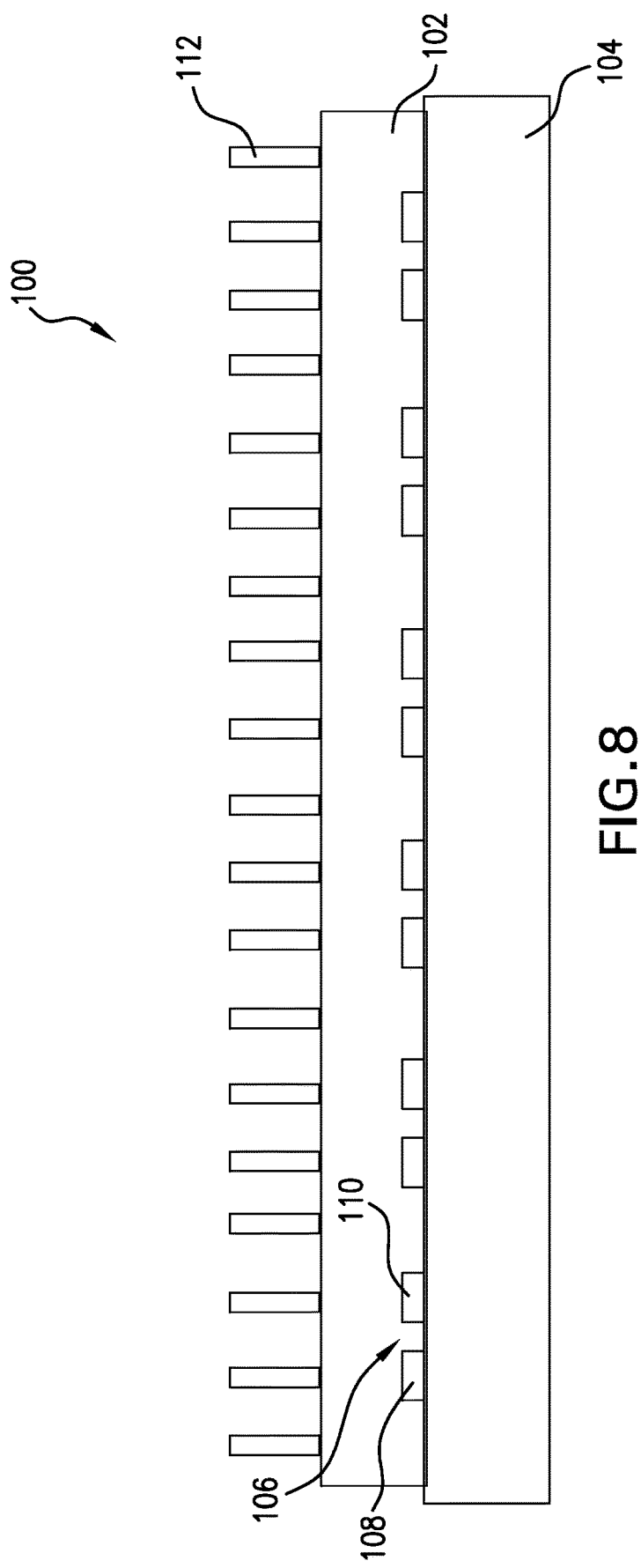
FIG. 8 is an illustration of a multi-pin connector mounted to an antenna backplane.

FIG. 8 is an illustration of a connector assembly 100 including a male connector 102 mounted to an antenna backplane 104. A plurality of differential pairs 106 each having opposing conductors 108 and 110 are formed on a top surface of the antenna backplane 104 and are coupled to the connector 102. A plurality of connecting pins 112 project from a top surface of the connector 102 opposite to the antenna backplane 104. The connector 102 can be configured to mate with a female connector (not shown) on a mating circuit board (not shown). The connector 102 can be replaced with a female connector where connecting pins would project from a corresponding male connector (not shown) on a mating circuit board (not shown). Impedance matching can be preserved along the differential pairs 106 on the antenna backplane 104 through the connector 102, through a corresponding mating connector (not shown) and along a corresponding differential pair on a mating circuit board (not shown).

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. An antenna backplane comprising:
   a printed circuit board (PCB) including a first differential pair having a first conductor and a second conductor and a second differential pair having a third conductor and a fourth conductor, wherein the first conductor is positioned a first distance from the second differential pair, the second conductor is positioned a second distance from the second differential pair, where the first distance is greater than the second distance, the third conductor is positioned the second distance from the first differential pair, and the fourth conductor is positioned a third distance from the first differential pair, where the third distance is greater than the second distance; and
   a phase-shifting series resonant circuit coupled between the first conductor and the fourth conductor, said phase-shifting series resonant circuit providing approximately an odd-integer multiple of a 180 degree phase shift at a predetermined frequency.

2. The antenna backplane of claim 1, wherein the phase-shifting series resonant circuit operates at a resonant frequency and the predetermined frequency is approximately the resonant frequency.

3. The antenna backplane of claim 1, wherein the odd-integer multiple is one.

4. The antenna backplane of claim 1, wherein the PCB includes a first side and the phase-shifting series resonant circuit includes a fifth conductor connected to the first conductor, said fifth conductor having a first length, and a sixth conductor connected to the fourth conductor, said sixth conductor having a second length and being parallel to the fifth conductor to provide an overlap distance, and wherein the first, second, third, fourth, fifth and sixth conductors are on the first side of the PCB and the first length and the second length provide the approximately odd-integer multiple of the 180 degree phase shift.

5. The antenna backplane of claim 4, wherein the PCB includes a second side having a conductive ground plane.

6. The antenna backplane of claim 1, wherein the phase-shifting series resonant circuit includes a fifth conductor coupled to the first conductor, said fifth conductor having a first length, and a sixth conductor coupled to the fourth conductor, said sixth conductor having a second length and being parallel to the fifth conductor to provide an overlap distance, and wherein the first length and the second length provide the approximately odd-integer multiple of the 180 degree phase shift.

7. The antenna backplane of claim 6, wherein the PCB has a first side, the fifth conductor and the sixth conductor are both on the first side of the PCB, and an edge of the sixth conductor is parallel to an edge of the fifth conductor for the overlap distance.

8. The antenna backplane of claim 6, wherein the PCB has a dielectric layer interposed between at least a part of the fifth conductor and a part of the sixth conductor, and wherein a face of the sixth conductor is parallel to a face of the fifth conductor for the overlap distance.

9. The antenna backplane of claim 6, wherein at least one of the fifth conductor or the sixth conductor meanders.

10. The antenna backplane of claim 1, wherein the PCB is a multilayer PCB, and wherein the phase-shifting series resonant circuit includes a fifth conductor coupled to the first conductor, said fifth conductor having a first length and being on one layer of the multilayer PCB, and a sixth conductor coupled to the fourth conductor, said sixth conductor having a second length and being on another layer of the multilayer PCB, a face of the sixth conductor is parallel to a face of the fifth conductor and defines an overlap distance, and wherein the first length and the second length provide the approximately odd-integer multiple of the 180 degree phase shift.

11. An antenna backplane comprising:
a printed circuit board (PCB) including a first side and a second side, said second side having a ground plane thereon;
a first differential pair provided on the first side of the PCB, said first differential pair including a first conductor and a second conductor;
a second differential pair provided on the first side of the PCB, said second differential pair including a third conductor and a fourth conductor, wherein the first conductor is a first distance from the second differential pair, the second conductor is a second distance from the second differential pair, where the first distance is greater than the second distance, the third conductor is the second distance from the first differential pair, and the fourth conductor is a third distance from the first differential pair, where the third distance is greater than the second distance;
a fifth conductor coupled to the first conductor, said fifth conductor having a first length and being on the first side of the PCB; and a sixth conductor coupled to the fourth conductor, said sixth conductor having a second length, and being on the first side of the PCB, wherein an edge of the fifth conductor is parallel to an edge of the sixth conductor to provide an overlap distance, and the fifth conductor and the sixth conductor form a phase-shifting series resonant circuit, said phase-shifting series resonant circuit providing approximately an odd-integer multiple of a 180 degree phase shift at a desired frequency.

12. The antenna backplane of claim 11, wherein the phase-shifting series resonant circuit exhibits a resonant frequency and the desired frequency is approximately the resonant frequency.

13. The antenna backplane of claim 11, wherein the odd-integer multiple is one.

14. The antenna backplane of claim 11, wherein at least one of the fifth conductor or the sixth conductor meanders.

15. An antenna backplane comprising:
a printed circuit board (PCB) having a first side;
a first differential pair provided on the first side of the PCB, said first differential pair including a first conductor and a second conductor;
a second differential pair provided on the first side of the PCB, said second differential pair including a third conductor and a fourth conductor, wherein the first conductor is a first distance from the second differential pair, the second conductor is a second distance from the second differential pair, where the first distance is greater than the second distance, the third conductor is the second distance from the first differential pair, and the fourth conductor is a third distance from the first differential pair, where the third distance is greater than the second distance;
a fifth conductor coupled to the first conductor, said fifth conductor having a first length, and being on the first side of the PCB; and
a sixth conductor coupled to the fourth conductor, said sixth conductor having a second length, and being on the first side of the PCB, wherein a face of the fifth conductor is parallel to a face of the sixth conductor for an overlap distance and the fifth conductor and the sixth conductor form a phase-shifting series resonant circuit that provides an approximately 180 degree phase shift at a desired frequency.

16. The antenna backplane of claim 15, wherein the phase-shifting series resonant circuit exhibits a resonant frequency and the desired frequency is approximately the resonant frequency.

17. The antenna backplane of claim 15, wherein the odd-integer multiple is one.

18. The antenna backplane of claim 15, wherein at least one of the fifth conductor or the sixth conductor meanders.

19. The antenna backplane of claim 15, wherein the PCB has a second side, the second side having a ground plane thereon, and the sixth conductor is on the second side.

20. The antenna backplane of claim 15, wherein the PCB is a multilayer printed circuit board, a first layer of the multilayer printed circuit board having the first side, a second layer of the multilayer printed circuit board having a second side, the first layer and the second layer being separated by a third layer, and the sixth conductor being on the second side.

* * * * *